United States Patent [19]
Lim

[11] Patent Number: 5,978,292
[45] Date of Patent: Nov. 2, 1999

[54] CONSUMPTION CURRENT CIRCUIT AND METHOD FOR MEMORY DEVICE

[75] Inventor: Dong-Chul Lim, Seoul, Rep. of Korea

[73] Assignee: LG Semicon Co., Ltd., Cheongju, Rep. of Korea

[21] Appl. No.: 09/027,895

[22] Filed: Feb. 23, 1998

[30] Foreign Application Priority Data

Apr. 7, 1997 [KP] DPR of Korea ................. 97/12660

[51] Int. Cl.$^6$ .......................................... G11C 7/00
[52] U.S. Cl. .................. 365/201; 365/203; 365/207
[58] Field of Search .............................. 365/208, 207, 365/203, 201, 191

[56] References Cited

U.S. PATENT DOCUMENTS 5,249,155  9/1993  Arimoto et al. ..................... 365/222
5,301,142  4/1994  Suzuki et al. ....................... 365/201
5,579,256  11/1996  Kajigaya et al. ................. 365/230.03

*Primary Examiner*—David Nelms
*Assistant Examiner*—Anh Phung
*Attorney, Agent, or Firm*—Fleshner & Kim

[57] ABSTRACT

A current control circuit and method for use in a memory device is provided that enhances operational reliability with respect to a test result. The current control circuit controls the current of a main amplifier by controlling current consumed in the test mode and non-test mode. The circuit can include a storage device for storing data and a signal amplifying block including a plurality of main amplifiers for amplifying a data from the storage device based on a read enable signal. A signal amplifying controller is for logically combining word line signals and a test mode signal to output the read enable signal and a test mode determination signal. A current control block is for controlling current of the signal amplifying block based on the test mode determination signal.

23 Claims, 8 Drawing Sheets

FIG.4
BACKGROUND ART
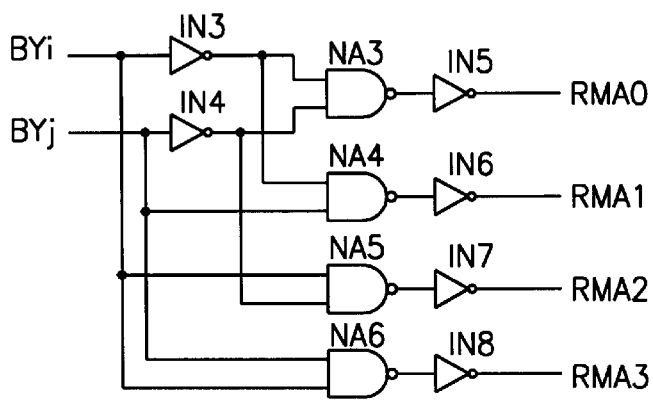
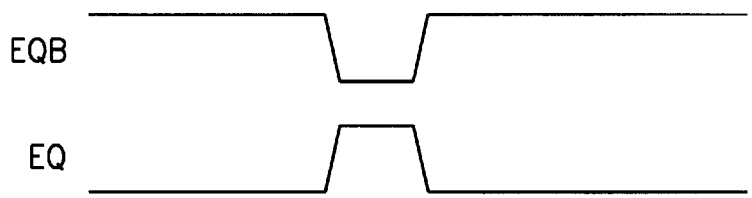
FIG.5A BACKGROUND ART — EQB
FIG.5B BACKGROUND ART — EQ
FIG.5C BACKGROUND ART — BYi
FIG.5D BACKGROUND ART — BYj
FIG.5E BACKGROUND ART — RMA
FIG.5F BACKGROUND ART — CIOT/B
FIG.5G BACKGROUND ART — MOT/B FIG.9A  EQB 
FIG.9B  EQ 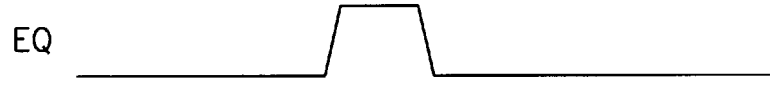
FIG.9C  BYi 
FIG.9D  BYj 
FIG.9E  TM         LOW 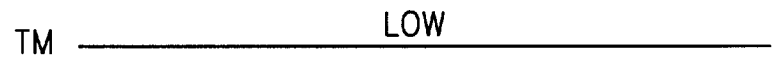
FIG.9F  RMA 
FIG.9G  RMAT 
FIG.9H  CIOT/B 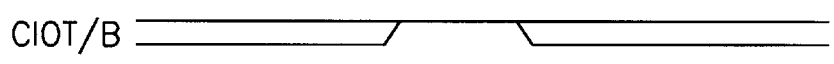
FIG.9I  MOT/B 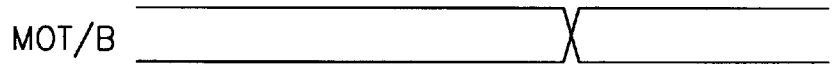

FIG.10A  EQB  
FIG.10B  EQ  
FIG.10C  BYi  
FIG.10D  BYj  
FIG.10E  TM  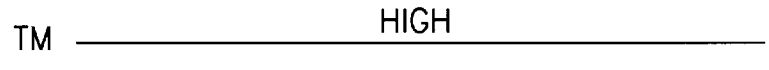
FIG.10F  RMA  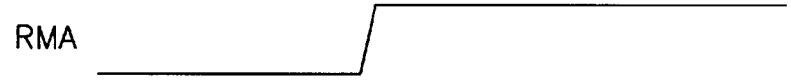
FIG.10G  RMAT  
FIG.10H  CIOT/B  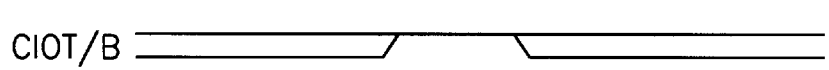
FIG.10I  MOT/B  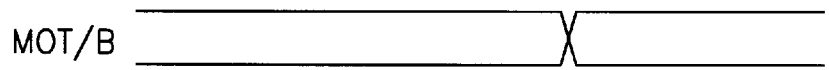

CONSUMPTION CURRENT CIRCUIT AND METHOD FOR MEMORY DEVICE

BACKGROUND OF THE INVENTION

1. Field of the Invention

The present invention relates to a memory device, and in particular, to a current controlling circuit for a memory device that controls current consumption.

2. Background of the Related Art

FIG. 1 illustrates the construction of a 16M related Dynamic Random Access Memory (RAM) formed of eight 2M bit memories. FIG. 2 illustrates a 2M bit DRAM of FIG. 1. Each 2M bit memory is formed of a memory block 101 having eight 256 bit memory cell arrays, a signal amplifying block 102 formed of four main amplifiers M/A1 through M/A4 for amplifying the data from the memory block 101 and a signal amplifying controller 103. The signal amplifying controller 103 outputs enable signals RMA0 through RMA3 to control the operation of the signal amplifying block 102.

As shown in FIG. 3, the four main amplifiers M/A1 through M/A4 each include a pre-charge circuit 111 for equalizing input lines CIOT and CIOB in accordance with an equalization signal EQB. A first differential amplifying circuit 112 is for differentially amplifying the signals from the input lines CIOT and CIOB when a read enable signal RMA is activated. A second differential amplifying circuit 113 is for differentially amplifying the output signal from the first differential amplifying circuit 112 when the read enable signal RMA is activated, and a latch unit 114 is for latching the output signal from the second differential amplifying circuit 113 and outputting an amplifying signal MOT/MOB.

The pre-charge circuit 111 is connected between the input lines CIOT and CIOB by connecting PMOS transistor P1 in parallel with PMOS transistors P2, and P3 between the input lines CIOT and CIOB. The equalization signal EQB is transmitted to the gates of the PMOS transistors P1 through P3, and an output signal VMP is outputted at the connection point between the PMOS transistors P2 and P3.

In the first differential amplifying circuit 112, NMOS transistors N1 through N3 and N4 through N6 are respectfully connected to PMOS transistors P4, P5 and P6, P7, which form a current mirror, to form a differential amplifier. The input line CIOT is connected to the gates of the NMOS transistors N1 and N5, respectively, and the input line CIOB is connected to the gates of the NMOS transistors N2 and N4, respectively. The read enable signal RMA is transmitted to the gates of the NMOS transistors N3 and N6. The connection point between the PMOS transistor P5 and the NMOS transistors N2 and the connection point between the PMOS transistor P7 and NMOS transistor N5 are respectively connected with the input terminals of the second differential amplifying circuit 113.

In the second differential amplifying circuit 113, the drain of the NMOS transistor N7, which receives a second output signal from the first differential amplifying circuit 112, is commonly connected to the drain of the PMOS transistor P8 and the gate of the PMOS transistor P9. The source of the PMOS transistor P8 receives a voltage Vcc. Thus, a first output terminal is formed.

The gate of the NMOS transistor N8 receives a first output signal from the first differential circuit 112. The drain of the NMOS transistor N8 is commonly connected with the gate of the PMOS transistor P8 and the drain of the PMOS transistor P9. The source of the PMOS transistor P9 receives the voltage Vcc. Thus, a second output terminal is formed. The drains of PMOS transistors P10 through P13 are respectively connected with the gates and drains of the NMOS transistors N7 and N8. The gates of PMOS transistors P10–P13 receive a read enable signal RMA.

In the latch unit 114, an input terminal of a NAND-gate NA1 receives a first output signal from the second differential amplifying circuit 113. The output signal from the NAND-gate NA1 is inputted into an input terminal of a NAND-gate NA2. Another input terminal of the NAND-gate NA2 receives a second output signal from the second differential amplifying circuit 113. Further, the output signal from the NAND-gate NA2 is inputted into another input terminal of the NAND-gate NA1. Then, the output signals from the NAND-gates NA1 and NA2 are respectively inputted into inverters IN1 and IN2, which output output signals MOT and MOB.

Transmission gates TG1, TG2 are respectively connected between the first and second output terminals of the first and second differential amplifying circuits 112 and 113. The transmission gates TG1 and TG2 are pre-charged in accordance with equalization signals EQ and EQB.

As shown in FIG. 4, the signal amplifying controller 103 includes inverters IN3 and IN4 for inverting input signals BYi and BYj. A NAND-gate NA3 NANDs the output signals from the inverters IN3 and IN4. An inverter IN5 is for inverting the output signal from the NAND-gate NA3 and outputting a read enable signal RMA0. A NAND-gate NA4 NANDs the input signal BYj and the output signal from the inverter IN3. An inverter N6 is for inverting the output signal from the NAND-gate NA4 and outputting a read enable signal RMA1. A NAND-gate NA5 NANDs the input signal BYi and the output signal from the inverter IN4. An inverter IN7 is for inverting the output signal from the NAND-gate NA5 and outputting a read enable signal RMA2. A NANDgate NA6 NANDs the input signals BYi and BYj, and an inverter IN8 inverts the output signal from the NAND-gate NA6 to output a read enable signal RMA3.

The operation of the related art circuit for a memory device will now be described. First, when a normal read operation is performed, the data stored in the eight 256 bit memory cell arrays of the memory block 101 are carried on a global data line through a local data line connected to both ends of the 256 bit memory cell array and are transmitted to the main amplifiers M/A1 through M/A4 of the signal amplifying block 102.

At this time, the signal amplifying controller 103 logically operates word line input signals BYi and BYj shown in FIGS. 5C and 5D to output a read enable signal RMA as shown in FIG. 5E to the signal amplifying block 102. The read enable signal RMA0 is outputted through the inverters IN3 and IN4, the NAND-gate NA3, and the inverter IN5 for enabling the main amplifier M/A1. The read enable signal RMA1 is outputted through the inverter IN3, the NAND-gate NA4, and the inverter IN6 for enabling a main amplifier M/A2. The enable signal RMA2 is outputted through the inverter IN4, the NAND-gate NA5, and the inverter IN7 for enabling a read main amplifier M/A3. The read enable signal RMA3 is outputted through the NAND-gate NA6 and the inverter IN8 for enabling a main amplifier M/A3.

Therefore, when the read enable signals RMA0 through RMA3 of the signal amplifying controller 103 are inputted into the signal amplifying block 102, only one or two of the main amplifiers M/A1 through M/A4 are operated. The data selected from the memory block 101 is amplified and then outputted.

A test mode operation is performed to reduce a testing time by reducing the number of addresses. In particular, a 16M DRAM is operated like a 1M DRAM by operating all the main amplifiers M/A1 through M/A4 of the signal amplifying block 102.

The data read by the memory block 101 is carried on the global data line through the local data line in accordance with an address and is transmitted to the signal amplifying block 102. At this time, the signal amplifying controller 103 logically combines the input signals BYi and BYj, outputs the read enable signals RMA0 through RMA3 to the signal amplifying block 102, respectively, and operates the main amplifiers M/A1 through M/A4. The main amplifiers M/A1 through M/A4 amplify the data from the memory block 101, so that the 16M DRAM is operated like the 1M DRAM.

The operation of the main amplifiers M/A1 through M/A4 in the normal mode and the test mode will now be described with reference to FIG. 3 and FIGS. 5A through 5G. As shown in FIGS. 5A and 5B, when the level of an equalization signal EQB is changed from high to low, in the pre-charge circuit 111 of the main amplifiers M/A1 through M/A4, the PMOS transistors P1 through P3 are turned on. Thus, the input terminals CIOT and CIOB are pre-charged to high level as shown in FIG. 5F.

At this time, the read enable signal RMA is low. Accordingly, in the differential amplifying circuit 113 of the main amplifiers M/A1 through M/A4, the PMOS transistors P12 and P13 are turned on. Thus, the output terminal is pulled up by the voltage Vcc, and the latch 114 maintains a previous output state.

When the signal amplifying controller 103 outputs the read enable signal RMA to the signal amplifying block 102 by receiving the word line signals BYi and BYj, one or two of the main amplifiers M/A1 through M/A4 is/are selected in the read mode, and all the main amplifiers M/A1 through M/A4 are selected in the test mode. For each main amplifier selected from the main amplifiers M/A1 through M/A4 in accordance with the read enable signal RMA, in the first and second differential amplifying circuits 112 and 113, the NMOS transistors N3, N6, and N9 are turned on.

As shown in FIGS. 5A and 5B, when the equalization signal EQB changes from low to high level, the operation of the pre-charge circuit 111 of the main amplifiers M/A1 through M/A4 is stopped. Then, the data from the input terminals CIOT and CIOB are inputted into the first differential amplifying circuit 112.

On the assumption that the level of the data from the input terminal CIOT is higher than that of the data from the input terminal CIOB, in the first differential amplifying circuit 112, the NMOS transistors N1 and N5 are turned on. The NMOS transistors N2 and N4 are turned off. Thus, the current flowing at the PMOS transistors P4 and P5, which form a current mirror, is transmitted to the second differential amplifying circuit 113. The PMOS transistors P6 and P7, which form a current mirror, maintain a turned-off state, whereby the current is not transmitted to the second differential amplifying circuit 113.

In the second differential amplifying circuit 113, the NMOS transistor N7 is turned on. Accordingly, the PMOS transistor P9 is turned on, the NMOS transistor N8 is turned off and the PMOS transistor P8 is turned off. Thus, only the current flowing at the PMOS transistor P9 is transmitted to the latch unit 114.

In the latch unit 114, the output signal from the NAND-gate NA2 becomes high. Then, the output signal from the NAND-gate NA1 becomes a low level signal. Accordingly, the high signal MOT is outputted from the inverter IN1, and the low level signal MOB is outputted from the inverter IN2. The output timing of the output signals MOT and MOB from the latch unit 114 is shown in FIG. 5G.

If the level of the data from the input terminal CIOT is assumed to be lower than that of the data from the input terminal CIOB, the first and second differential amplifying circuits 112 and 113 are then operated in the reverse sequence. In this case, the low signal MOT and the high signal MOB are outputted from the latch unit 114.

However, in the related art circuit for a memory device, the main amplifiers are partially selected. When the number of concurrently operated main amplifiers is decreased to ½ or ¼, the power supply becomes unstable because of an over current. In addition, in the test mode, since all the amplifiers are operated, the operational current is increased by two times or four times, which causes unstable operation. In this case, the operational accuracy of the test result is degraded.

SUMMARY OF THE INVENTION

An object of the present invention to provide a consumption current decreasing circuit and method for a memory device that overcomes at least the aforementioned problems encountered in the related art.

Another object of the present invention to provide a current controlling circuit and method for a memory device that reduces a current consumption of a main amplifier in the test mode.

A further object of the present invention to provide a current control circuit and method for a semiconductor device that enhances an operational reliability by operating test and normal operations under substantially similar conditions.

To achieve at least the above objects in whole or in parts, there is provided a consumption current decreasing circuit for a memory device according to the present invention that includes a memory block for storing a data, a signal amplifying block including a plurality of main amplifiers for amplifying a data from the memory block in accordance with a read enable signal, a signal amplifying controller for logically combining word line signals and a test mode signal to output the read enable signal and a test mode determination signal, and a current control block for controlling a current flow of the signal amplifying block in accordance with the test mode determination signal.

To further achieve the above objects, there is provided a current control circuit for use in a memory device according to the present invention that includes a DRAM including a plurality of 2M bit memories each having a memory block for storing a data, a signal amplifier having a plurality of main amplifiers for amplifying the data from the memory block in accordance with a read enable signal, a signal amplifying controller for logically combining word line signals and a test mode signal to output a test mode determination signal and the read enable signal, and a current controller for controlling a current flow of the signal amplifier in accordance with the test mode determination signal.

To still further achieve the above objects, there is provided a current control method for use in a semiconductor device according to the present invention that includes storing data in a memory device; amplifying the data from the memory device with a plurality of amplifiers based on a read enable signal; processing input signals and a test signal to output the read enable signal and a test mode determination signal; and controlling current transmitted by the plurality of amplifiers based on the test mode determination signal, wherein the controlling current step comprises applying current at first and second differential amplifying circuits of each of the plurality of amplifiers to a reference voltage based on the test mode determination signal.

Additional advantages, objects, and features of the invention will be set forth in part in the description which follows and in part will become apparent to those having ordinary skill in the art upon examination of the following or may be learned from practice of the invention. The objects and advantages of the invention may be realized and attained as particularly pointed out in the appended claims.

BRIEF DESCRIPTION OF THE DRAWINGS

The invention will be described in detail with reference to the following drawings in which like reference numerals refer to like elements wherein:

FIG. 4 is a circuit diagram illustrating a signal amplifying controller in the circuit of FIG. 2;

FIGS. 5A–5G are diagrams illustrating signal waveforms of elements of the circuit of FIG. 2;

FIGS. 9A–9I are diagrams of signal waveforms of elements of the circuit of FIG. 6; and FIGS. 10A–10I are diagrams of additional signal waveforms of elements of the circuit of FIG. 6.

DETAILED DESCRIPTION OF PREFERRED EMBODIMENTS

Figure 1:
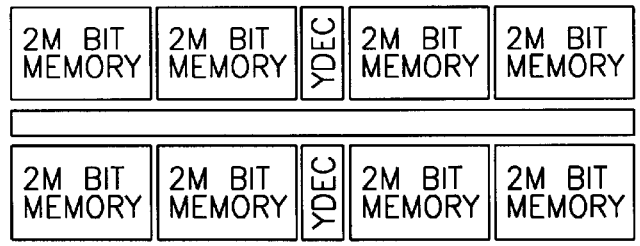
FIG. 1 is a diagram illustrating a related art DRAM.
Figure 2:
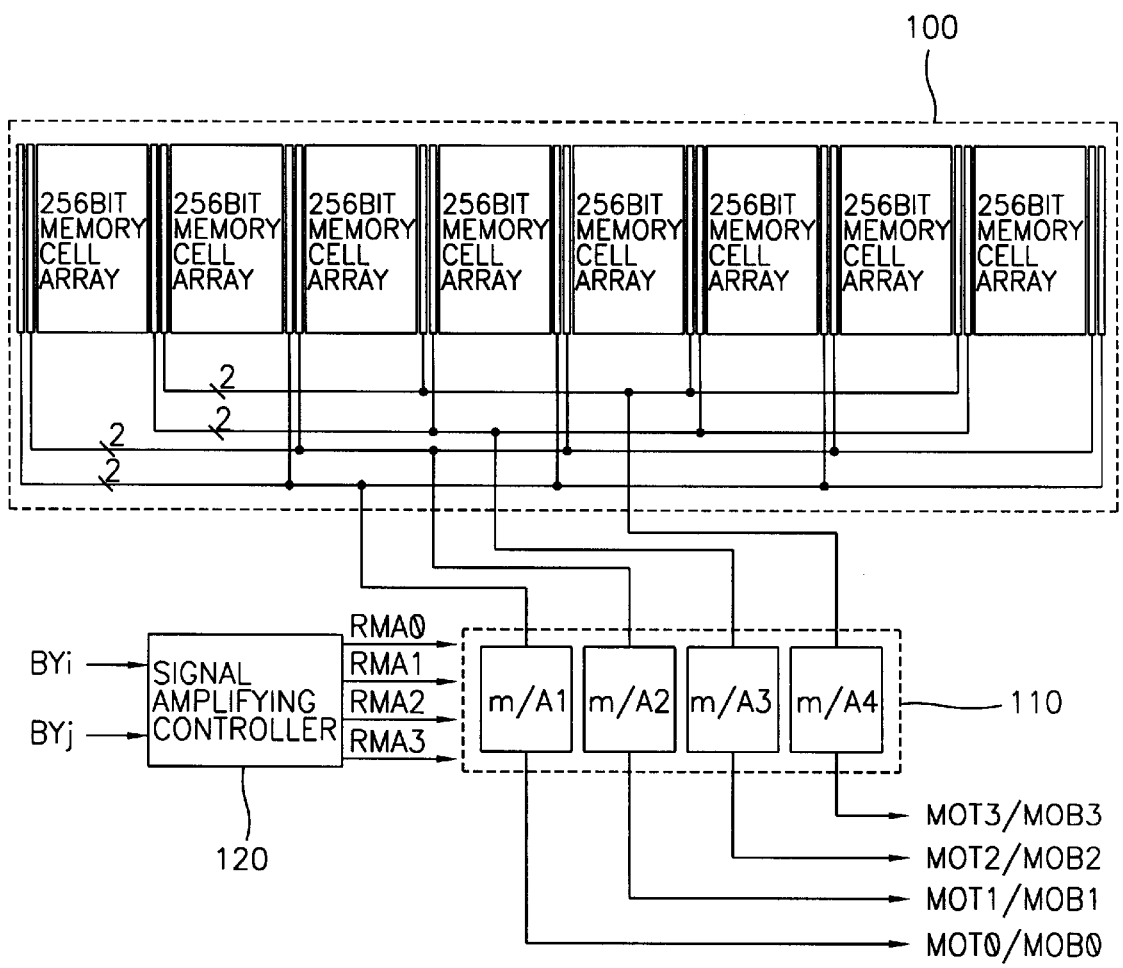
FIG. 2 is a diagram illustrating a 2M bit DRAM of FIG. 1.
Figure 3:
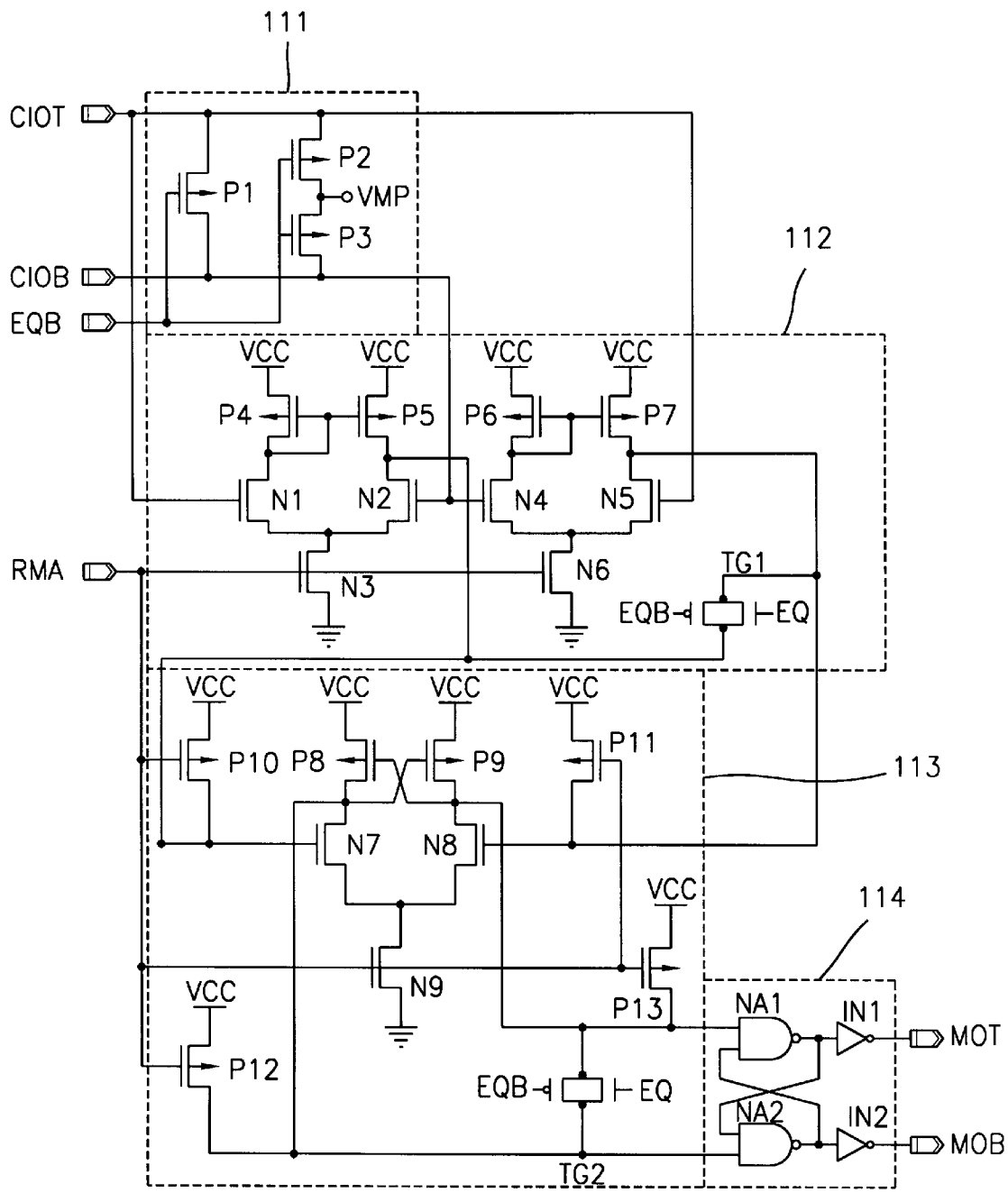
FIG. 3 is a circuit diagram illustrating a main amplifier of FIG. 2.
Figure 6:
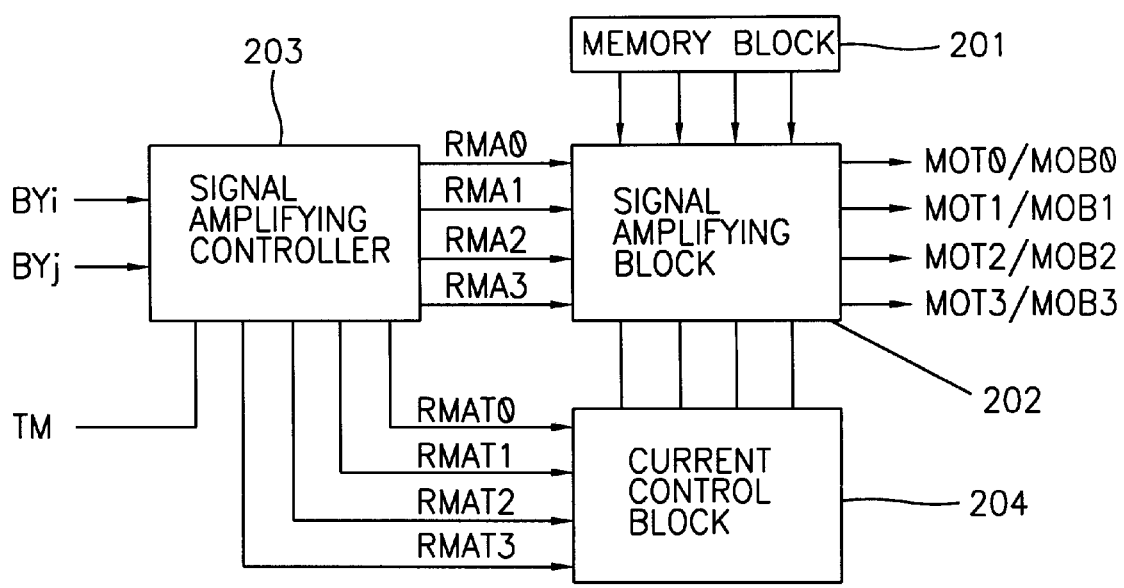
FIG. 6 is a block diagram illustrating a preferred embodiment of a memory according to the present invention.

FIG. 6 illustrates a preferred embodiment of a semiconductor device according to the present invention. As shown in FIG. 6, a 2M bit memory according to the present invention includes a memory block 201 formed of eight 256 bit memory cell arrays, a signal amplifying block 202 formed of four main amplifiers M/A21 through M/A24 for amplifying the data from the memory block 201, a signal amplifying controller 203 and a current control block 204. The signal amplifying controller 203 receives word line signals BYi and BYj and a test mode signal TM and outputs enable signals RMA0 through RMA3 and test mode determination signals RMAT0 through RMAT3. The current control block 204 reduces the current of the signal amplifying block 202 when test mode determination signals RMAT0 through RMAT3 from the signal amplifying controller 203 become low level.

Figure 7:
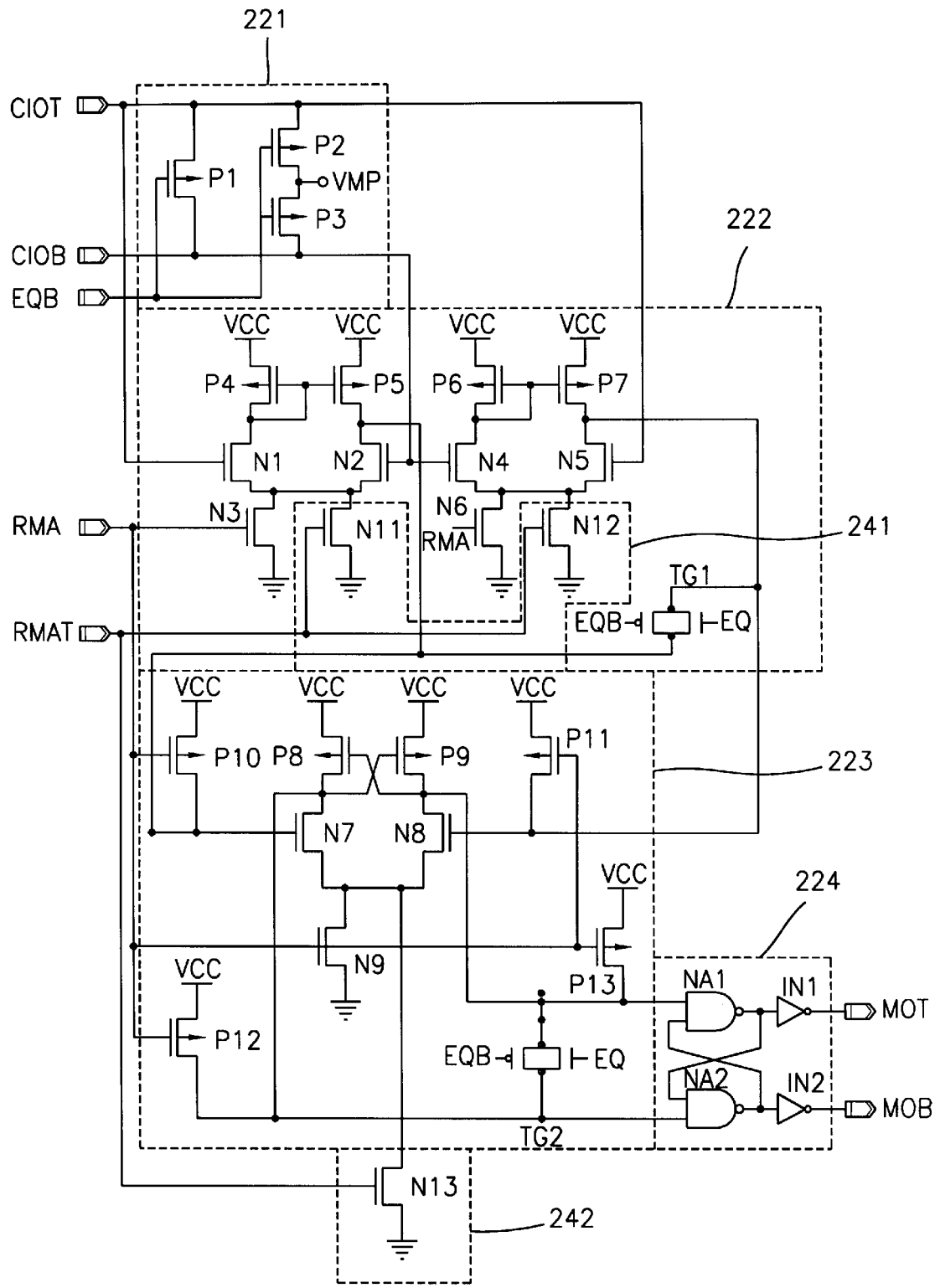
FIG. 7 is a circuit diagram illustrating a coupling between a main amplifier and a current control circuit in the circuit of FIG. 6.

The signal amplifying block 202 includes the four main amplifiers M/A21 through M/A24. The four main amplifiers M/A21 through M/A24 are similar to the related art main amplifiers. As shown in FIG. 7, the four main amplifiers M/A21 through M/A24 each include a pre-charge circuit 211, first and second differential amplifying circuits 212 and 213, and the latch unit 214. The memory block 201 is similar to the related art memory block. Accordingly, a detailed description will be omitted.

Figure 8:
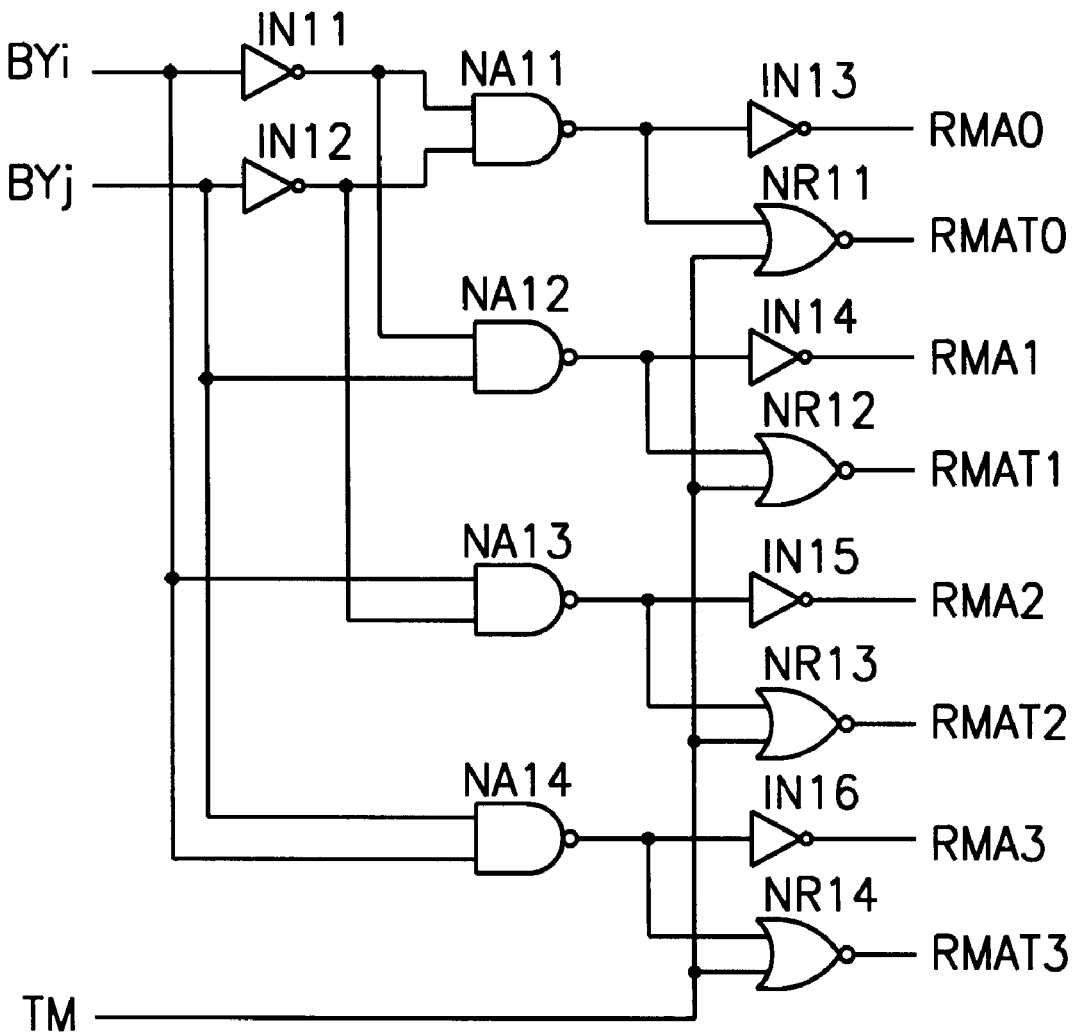
FIG. 8 is a circuit diagram illustrating a signal amplifying controller in the circuit of FIG. 6.

As shown in FIG. 8, the signal amplifying controller 203 includes inverters IN11 and IN12 that respectively invert input signals BYi and BYj. A NAND-gate NA11 NANDs the output signals from the inverters IN11 and IN12. An inverter IN13 is for inverting the output signal from the NAND-gate NA11 to output a read enable signal RMA0. A NAND-gate NA12 NANDs the input signal BYj and the output signal from the inverter IN11. An inverter IN14 is for inverting the output signal from the NAND-gate NA12 output a read enable signal RMA1. A NAND-gate NA13 NANDs the input signal BYi and the output signal from the inverter IN12. An inverter IN15 is for inverting the output signal from the NAND-gate NA13 to output a read enable signal RMA2. A NAND-gate NA14 NANDs the input signals BYi and BYj. An inverter IN16 is for inverting the output signal from the NAND-gate NA14 outputs a read enable signal RMA3. NOR-gates NR11 through NR14 are for NORing the test mode signal TM and respective output signals from the NAND-gates NA11 through NA14 to output test mode determination signals RMAT0 through RMAT3.

As shown in FIG. 7, the current control block 204 includes first and second current control circuits 221 and 222 coupled to the main amplifiers M/A21 through M/A24. The first current control circuit 221 is coupled to two differential amplifiers of the first differential amplifier circuit 212. The first current control circuit 221 includes NMOS transistors N11 and N12 that are turned off when the test mode determination signal RMAT becomes low level to decrease a current amount in the main amplifier. The second current control circuit 222 is coupled to the second differential amplifying circuit 213. The second current control circuit includes a NMOS transistor N13 that is turned off when the test mode determination signal RMAT becomes a low level to decrease the flowing current.

Operation and effects of consumption current decreasing for the memory device according to the present invention will now be described. When the circuit is normally operated, as shown in FIGS. 9A and 9B, the equalization signal EQB becomes low level. Accordingly, the input terminals CIOT and CIOB are pre-charged by the pre-charge circuit 211 of the main amplifiers M/A21 through M/A24 of the signal amplifying block 202. Then, in the signal amplifying controller 203, the word line signals BYi and BYj shown in FIGS. 9C and 9D logically combine using the NAND-gates NA11 through NA14 and the inverters IN11 through IN16 to generate the read enable signals RMA0 through RMA3. The read enable signals RMA0 through RMA3 are inputted into the signal amplifying block 202. At this time, only one or two of the main amplifiers M/A21 through M/A24 in the signal amplifying block 202 is/are operated.

Operation will now be described on the assumption that only the read enable signal RMA0 as shown in FIG. 9F becomes high level. Thus, only the main amplifier M/A21 is operating.

Since the test mode signal TM as shown in FIG. 9E maintains a low level, only the output signal from the NAND-gate NA11 is low level in the signal amplifying controller 203. Accordingly, the test mode determination signal RMAT0 from the NOR-gate NR11 is high level as shown in FIG. 9G.

The NMOS transistors N11 through N13 of the first and second current control circuits 221 and 222 coupled to the main amplifier M/A21 are turned on, and then are respectively coupled to the first and second differential amplifying circuits 212 and 213 of the main amplifier M/A21.

Therefore, after the equalization signal EQB a shown in FIGS. 9A and 9B becomes high level, the data stored in eight 256-bit memory cell arrays of the memory block 201 are carried on the global data line through the local data line disposed at both portions of a 256-bit cell array and transmitted to the signal amplifying block 202. Then, the data stored in the memory block 201 are transmitted to the input terminals CIOT and CIOB of the main amplifier M/A21.

On the assumption that the level of the data from the input terminal CIOT is higher than that of the data from the input terminal CIOB, in the first differential amplifying circuit 212, the NMOS transistors N1 and N5 are turned on. The NMOS transistors N2 and N4 are turned off. Thus, the current that flows through the PMOS transistors P4 and P5, which form a current mirror, is transmitted to the second differential amplifying circuit 213. The PMOS transistors P6 and P7, which form a current mirror, maintains a turned-off state. Therefore, current does not flow to the second differential amplifying circuit 213 from the PMOS transistors P6 and P7.

The current that flows from the PMOS transistors P4 and P5 to the NMOS transistor N1 flows to ground through the NMOS transistor N3 and to the ground through the NMOS transistor N11 of the first current control circuit 221.

In the second differential amplifying circuit 213, the NMOS transistor N7 is turned on. Accordingly, the PMOS transistor P9 is turned on, the NMOS transistor N8 is turned off and the PMOS transistor P8 is turned off. Thus, only the current, which is activated as the PMOS transistor P9 is turned on, is transmitted to the latch unit 214. The current from the NMOS transistor N7 flows to the ground through the NMOS transistor N9 and to the ground through the NMOS transistor N13 of the second current control circuit 222, respectively.

In the latch unit 214, the output signal from the NAND-gate NA2 becomes a high level. The output signal from the NAND-gate NA1 becomes a low level. Accordingly, the high level signal MOT is outputted from the inverter IN1, and the low level signal MOB is outputted from the inverter IN2.

On the contrary, if the level of the input terminal CIOT is assumed to be lower than that of the data from the input terminal CIOB, the first and second amplifying circuits 212 and 213 are operated in reverse. In this case, the current transmitted from the PMOS transistors P6 and P7, which is a current mirror in the first differential amplifying circuit 212, flows through the NMOS transistor N4 and is transmitted to the ground through the NMOS N6, and the NMOS transistor N12 of the first current control circuit 221. The current transmitted through the NMOS transistor N8 of the second differential amplifying circuit 213 is transmitted to the ground through the NMOS transistor N9 and to the ground through the NMOS transistor N13 of the second current control circuit 222. Therefore, the latch unit 214 outputs a low level signal MOT and a high level signal MOB, respectively. The output timing of the output signals MOT and MOB of the latch unit 214 is shown in FIG. 9I.

When the test mode is set, the test mode signal TM as shown in FIG. 10E maintains a high level. The signal amplifying controller 203 always outputs the test mode determination signals RMAT0 through RMAT3 at low level. Thus, the NMOS transistors N11 through N13 forming the first and second current control circuits 221 and 222 of the current control block 204 are turned off.

The pre-charge circuit 211 of the main amplifiers M/A21 through M/A24 is activated by the equalization signal EQB and EQ respectfully shown in FIGS. 10A and 10B. When the input terminals CIOT and CIOB are equalized, the signal amplifying controller 203 logically combines the word line signals BYi and BYj and outputs read enable signals RMA0 through RMA3 at low levels. Thus, the main amplifiers M/A21 through M/A24 of the signal amplifying block 202 are activated so that a 16M DRAM operates as a 1M DRAM.

Then, the equalization signal EQB are shown in FIGS. 10A is converted from a low level to a high level. When the data from the memory block 201 is inputted into the signal amplifying block 202 by the address signal, the main amplifiers M/A21 through M/A24 operate identically to the operation in the normal mode. Since the first and second current control circuits 221 and 222 of the current control block 204 are not operated, the current transmitted at the first and second differential amplifying circuits 212 and 213 only flows to the ground through the NMOS transistors N3 (or N6) and N9.

The latch unit 214 that received the output signal from the second differential amplifying circuit 213 outputs output signals MOT and MOB with the timing shown in FIG. 10I. Thus, because the current control block 204 is not operated, the current consumption in the main amplifiers M/A21 through M/A24 is reduced.

As described above, the preferred embodiment of the memory block according to the present invention has various advantages. A consumption current decreasing circuit for a memory device according to the present invention controls a current flow in the normal mode and the test mode so that the current characteristics in the normal mode and the test mode can be identically judged. Accordingly, the reliability of the test result is enhanced.

The foregoing embodiments are merely exemplary and are not to be construed as limiting the present invention. The present teaching can be readily applied to other types of apparatuses. The description of the present invention is intended to be illustrative, and not to limit the scope of the claims. Many alternatives, modifications, and variations will be apparent to those skilled in the art.

What is claimed is:

1. A current control circuit for a semiconductor device, comprising:
    a memory block that stores data;
    a signal amplifying block including a plurality of amplifiers that amplify the data from the memory block based on a read enable signal;
    a signal amplifying controller that logically processes input signals and a test signal to output the read enable signal and a test mode determination signal; and
    a current control block that controls current transmitted by the signal amplifying block based on the test mode determination signal.

2. The circuit of claim 1, wherein the current control block includes first and second current control units to control current transmitted by the amplifiers of the signal amplifying block.

3. The circuit of claim 2, wherein each of the plurality of amplifiers comprises:
    a pre-charge circuit;
    a first differential amplifying circuit;
    a second differential amplifying circuit; and
    a latch unit, wherein the first current control unit is coupled to the first differential amplifying circuit and applies current at the first differential amplifying circuit to a reference voltage based on the test mode determination signal.

4. The circuit of claim 3, wherein the first current control unit includes a plurality of transistors, wherein each of the transistors is coupled to one of a plurality of differential amplifiers of the first differential amplifying circuit, and wherein the transistors receive the test mode determination signal.

5. The circuit of claim 4, wherein reference voltage is ground, wherein the transistors are disabled in a test mode and enabled in a nontest mode based on the test mode determination signal.

6. The circuit of claim 3, wherein the second current control circuit is coupled to the second differential amplifying circuit to apply current at the second differential amplifying circuit to a reference voltage based on test mode determination signal.

7. The circuit of claim 5, wherein the second current control unit includes a plurality of switching devices, each of the switching devices is coupled to one of a plurality of differential amplifiers of the second differential amplifying circuit, and wherein the switching devices receive the test mode determination signal.

8. The circuit of claim 7, wherein reference voltage is ground, wherein the switching devices are transistors that are disabled in a test mode and enabled in a non-test mode based on the test mode determination signal.

9. The circuit of claim 8, wherein the current control block operates the plurality of amplifiers under substantially identical conditions in the non-test mode and the test mode.

10. The circuit of claim 1, wherein the signal amplifying controller comprises:
a plurality of logic gates to logically process each of the input signals; and
a plurality of first circuits that receive combinations of the input signals and the logically processed input signals to output a plurality of read enable signals.

11. The circuit of claim 10, wherein the signal amplifying controller further comprises a plurality of second circuits that receive the test signal and respective output signals from the plurality of first circuits to output a plurality of test mode determination signals.

12. The circuit of claim 11, wherein each of the plurality of amplifiers in the signal amplifying block respectively receives one of the read enable signals and the test mode determination signals.

13. The circuit of claim 12, wherein the plurality of inverters includes first and second inverters that respectively invert each of two input signals, wherein each of four first circuits include a first logic-gate and an inverter to output one of four read enable signals, and wherein each of four second circuits include a second logic-gate to output one of four test mode determination signals.

14. The circuit of claim 13, wherein the first logic-gates are NAND-gates and the second logic gates are NOR-gates.

15. A current control circuit for a semiconductor device, comprising:
a memory block that stores data;
a signal amplifying block including a plurality of amplifiers that amplify the data from the memory block based on a first signal;
a signal amplifying controller that logically processes a second signal and a third signal to output the first signal and a fourth signal; and
a current control block that controls current transmitted by the signal amplifying block based on the fourth signal.

16. The circuit of claim 15, wherein the current control block includes first and second current control units to control current transmitted by the amplifiers of the signal amplifying block.

17. The circuit of claim 16, wherein each of the plurality of amplifiers comprises:
a pre-charge circuit; and
a first and second differential amplifying circuits, wherein the first and second current control units are respectively coupled to the first and second differential amplifying circuits to apply current at the first and second differential amplifying circuits to a reference voltage based on the fourth signal.

18. The circuit of claim 17, wherein the signal amplifying controller comprises:
a plurality of inverters for inverting each of a plurality of input signals comprising the second signal;
a plurality of first circuits that receive combinations of the input signals and the inverted input signals to output the first signal;
a plurality of second circuits for logically processing the third signal and respective output signals from the plurality of first circuits to output the fourth signal, wherein each of the plurality of amplifiers in the signal amplifying block respectively receives the first signal and the fourth signal.

19. A method for current control in a memory device, comprising:
storing data in a memory device;
amplifying the data from the memory device using a signal amplifier including a plurality of amplifiers based on a read enable signal;
processing input signals and a test signal to output the read enable signal and a test mode determination signal; and
controlling current transmitted by the signal amplifier based on the test mode determination signal, wherein the controlling current step uses first and second current control circuits to control current transmitted by the amplifiers of the signal amplifier.

20. The method of claim 19, further comprising:
inverting each of the input signals;
logically processing combinations of the input signals and the inverted input signals in a plurality of first circuits to output a plurality of read enable signals;
logically processing the test signal and respective output signals from the plurality of first circuits to output a plurality of test mode determination signals, wherein each of the plurality of amplifiers respectively receives one of the read enable signals and the test mode determination signals.

21. The method of claim 19, wherein the current controlling step comprises applying current at first and second differential amplifying circuits of each of the plurality of amplifiers to a reference voltage based on the test mode determination signal.

22. The method of claim 19, wherein the step of processing input signals and a test signal to output the read enable signal and a test mode determination signal is performed by a plurality of logic gates which logically process each of the input signals, and a plurality of first circuits that receive combinations of the input signals and the logically processed input signals to output a plurality of read enable signals.

23. The circuit of claim 10, wherein each of said plurality of logic gates comprises an inverter.

* * * * *

UNITED STATES PATENT AND TRADEMARK OFFICE
CERTIFICATE OF CORRECTION

PATENT NO : 5,978,292
DATED : November 2, 1999
INVENTOR(S): Dong-Chul LIM

It is certified that error appears in the above-identified patent and that said Letters Patent are hereby corrected as shown below:

On the Title Page:

[30] Foreign Application Priority Data

Change "[KP] DPR of Korea" to --[KR] Rep. of Korea--

Signed and Sealed this

Third Day of April, 2001

Attest:

NICHOLAS P. GODICI

*Attesting Officer*    *Acting Director of the United States Patent and Trademark Office*